(12) United States Patent
Lee

(10) Patent No.: US 7,925,032 B2
(45) Date of Patent: Apr. 12, 2011

(54) METHOD OF CONTROLLING VOLUME OF REPRODUCING APPARATUS AND REPRODUCING APPARATUS USING THE SAME

(75) Inventor: Joo-Yong Lee, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 1119 days.

(21) Appl. No.: 11/609,434

(22) Filed: Dec. 12, 2006

(65) Prior Publication Data

US 2007/0172084 A1    Jul. 26, 2007

(30) Foreign Application Priority Data

Jan. 24, 2006 (KR) .................. 10-2006-0007215

(51) Int. Cl.
*H03G 7/00* (2006.01)
(52) U.S. Cl. ......... 381/107; 381/104; 381/108; 381/109
(58) Field of Classification Search .................. 381/107, 381/109, 108, 104; 700/94
See application file for complete search history.

(56) References Cited

U.S. PATENT DOCUMENTS

| 5,945,988 A * | 8/1999 | Williams et al. .............. 715/747 |
| 2006/0106472 A1 * | 5/2006 | Romesburg et al. ............ 700/94 |

* cited by examiner

*Primary Examiner* — Vivian Chin
*Assistant Examiner* — Douglas J Suthers
(74) *Attorney, Agent, or Firm* — Lee, Hong, Degerman, Kang & Waimey

(57) ABSTRACT

The present invention relates to a method of controlling a volume of a reproducing apparatus and a reproducing apparatus using the same, wherein a reproduction volume of an audio file can be automatically controlled in accordance with information on a volume level of the audio file. The reproducing apparatus of the present invention includes a memory for storing at least one audio file and volume level information for controlling a reproduction volume level of the audio file, and a control unit for controlling a reproduction volume of the audio file in accordance with the volume level information recorded corresponding to the audio file when the audio file stored in the memory is reproduced.

28 Claims, 3 Drawing Sheets

METHOD OF CONTROLLING VOLUME OF REPRODUCING APPARATUS AND REPRODUCING APPARATUS USING THE SAME

CROSS-REFERENCE TO RELATED APPLICATIONS

Pursuant to 35 U.S.C. §119(a), this application claims the benefit of earlier filing date and right of priority to Korean Application No. 10-2006-0007215, filed on Jan. 24, 2006, the contents of which are hereby incorporated by reference herein in their entirety.

FIELD OF THE INVENTION

The present invention relates to a method of controlling a volume of a reproducing apparatus and a reproducing apparatus using the same. More particularly, the present invention relates to a method of controlling a volume of a reproducing apparatus and a reproducing apparatus using the same, wherein a reproduction volume of an audio file can be automatically controlled in accordance with information of a volume level of the audio file which has been controlled and recorded beforehand by a user.

DESCRIPTION OF THE RELATED ART

A typical example of an audio file is an MP3 file. The MP3 refers to an MPEG layer 3. Further, the MP3 file refers to an audio file that is produced by compressing audio signals by the MPEG layer 3.

A volume of the audio file is maintained at a volume level of the audio signal before compression. Thus, when a plurality of audio files are reproduced, they may have different volume levels from each other. If a plurality of audio files set at different volume levels are reproduced, the volume levels of the reproduced audio signals are uneven. Therefore, there is a problem in that, whenever audio files are changed, a user has to control the volume levels of the audio files one by one.

Therefore, there is a need for a method and apparatus for effectively controlling the volume of a reproducing apparatus for reproducing an audio file. The present invention addresses these and other needs.

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

The invention is directed to a method for controlling a volume of a reproducing apparatus and a reproducing apparatus using the same, wherein a reproduction volume of an audio file can be automatically controlled in accordance with information on a volume level of the audio file which has been controlled and recorded beforehand by a user.

The present invention is conceived to solve the aforementioned problem in the prior art. Accordingly, an object of the present invention is to provide a method of controlling a volume of a reproducing apparatus and a reproducing apparatus using the same by which a reproduction volume of an audio file can be automatically adjusted in accordance with information on a volume level of the audio file which has been controlled and recorded beforehand by a user.

In one embodiment of the present invention, there is provided a reproducing apparatus which comprises a memory for storing at least one audio file and volume level information for controlling a reproduction volume level of the audio file, and a control unit for controlling a reproduction volume of the audio file in accordance with the volume level information recorded corresponding to the audio file when the audio file stored in the memory is reproduced.

In an aspect of the invention, the volume level information comprises at least one of offset information and a value of the reproduction volume level.

The reproducing apparatus may further comprise an offset information processing unit for calculating the offset information through volume control input from the outside and recording the calculated offset information in the audio file while the audio file is reproduced.

In another aspect of the invention, the offset information processing unit comprises a recognition unit for recognizing an input of a predetermined key while the audio file is reproduced, a calculating unit for calculating the offset information in accordance with an input value recognized by the recognition unit, and a recording unit for recording the offset information calculated by the calculating unit in the memory.

The offset information processing unit updates the offset information by summing up the offset information recorded in the audio file and an offset information calculated from another input of the predetermined key.

In another aspect of the invention, the control unit comprises a volume control unit for controlling the reproduction volume level of the audio file in accordance with the offset information stored in the memory, and an output unit for outputting audio data of the audio file at the reproduction volume level controlled by the volume control unit.

The control unit further comprises a volume level recording unit for recording the value of the reproduction volume level of the audio file in the memory and outputs the audio data of the audio file in accordance with the recorded value of the reproduction volume level.

The volume control unit controls the reproduction volume level by reflecting the offset information of the audio file and a volume level of an operating mode selected from operating modes each having a set volume level.

The recording unit records the offset information set through the volume control input by a user in a region additionally allocated in the memory.

Furthermore, the recording unit records the offset information set through the volume control input by a user as a history. The control unit controls the reproduction volume level in accordance with offset information selected from the history.

In another aspect of the invention, the offset information is recorded in a header of the audio file.

The recognition unit recognizes the volume level adjusted by a side key or button key provided in the reproducing apparatus.

According to another aspect of the present invention, there is provided a method of controlling a volume of an apparatus for reproducing at least one audio file, which comprises the steps of determining whether volume level information for controlling a reproduction volume level of an audio file is recorded in a memory; and if it is determined in the determining step that the volume level information has been recorded in the memory, controlling a reproduction volume of the audio file in accordance with the recorded volume level information and outputting audio data of the audio file at the controlled reproduction volume.

The volume level information comprises at least one of offset information and a value of the reproduction volume level. The method of the present invention may further comprise an offset information processing step of calculating the offset information through volume control input from the outside and recording the calculated offset information in the audio file while the audio file is reproduced.

The offset information processing step comprises a recognizing step of recognizing an input of a predetermined key while the audio file is reproduced, a calculating step of calculating the offset information in accordance with an input value recognized by the recognition step, and a recording step of recording the offset information calculated by the calculating step in the memory.

The offset information processing step comprises the step of updating the offset information by summing up the offset information recorded in the audio file and an offset information calculated from another input of the predetermined key. The offset information is recorded in a header of the audio file.

In another aspect of the invention, the controlling step comprises the step of outputting the audio data of the audio file at a reproduction volume level calculated by summing up a reference volume level and the offset information of the audio file.

The controlling step comprises the step of outputting the audio data of the audio file at a reference volume level, if it is determined in the determining step that the volume level information has not been recorded in the memory. On the other hand, the controlling step further comprises the step of outputting the audio data of the audio file in accordance with the recorded value of the reproduction volume level.

The controlling step comprises the step of controlling the reproduction volume level by reflecting the offset information of the audio file and a volume level of an operating mode selected from at least one operating mode and outputting the audio data of the audio file at the controlled reproduction volume level.

In another aspect of the invention, the recording step comprises the step of recording the offset information set through the volume control input by a user in a region additionally allocated in the memory.

The recording step further comprises the step of recording the offset information set through the volume control input by a user as a history.

In still another aspect of the invention, the outputting step comprises the step of controlling the reproduction volume level in accordance with offset information selected from the history.

The recognizing step comprises the step of recognizing the volume level adjusted by a side key or button key input provided in the reproducing apparatus.

BRIEF DESCRIPTION OF THE DRAWINGS

The accompanying drawings, which are included to provide a further understanding of the invention and are incorporated herein and constitute a part of this specification, illustrate embodiments of the invention and together with the description serve to explain the principles of the invention. Features, elements, and aspects of the invention that are referenced by the same numerals in different figures represent the same, equivalent, or similar features, elements, or aspects in accordance with one or more embodiments.

The above and other objects, features and advantages of the present invention will become apparent from the following description of a preferred embodiment given in conjunction with the accompanying drawings, in which.

DETAILED DESCRIPTION OF THE PREFERRED EMBODIMENTS

The present invention relates to a method of controlling a volume of a reproducing apparatus and a reproducing apparatus using the same, wherein a reproduction volume of an audio file can be automatically controlled in accordance with information of a volume level of the audio file which has been controlled and recorded beforehand by a user. Although the reproducing apparatus for performing a volume control method is described as a mobile communication terminal in this embodiment of the present invention, the present invention can be applied to a variety of information processing apparatus (e.g., an MP3 player, a home theater system, a computer system, a karaoke system, etc.) in addition to the mobile communication terminal.

Reference will now be made in detail to the preferred embodiments of the present invention, examples of which are illustrated in the accompanying drawings.

Hereinafter, a method of controlling a volume of a reproducing apparatus and a reproducing apparatus using the same according to an embodiment of the present invention will be described in detail with reference to the accompanying drawings.

Figure 1:
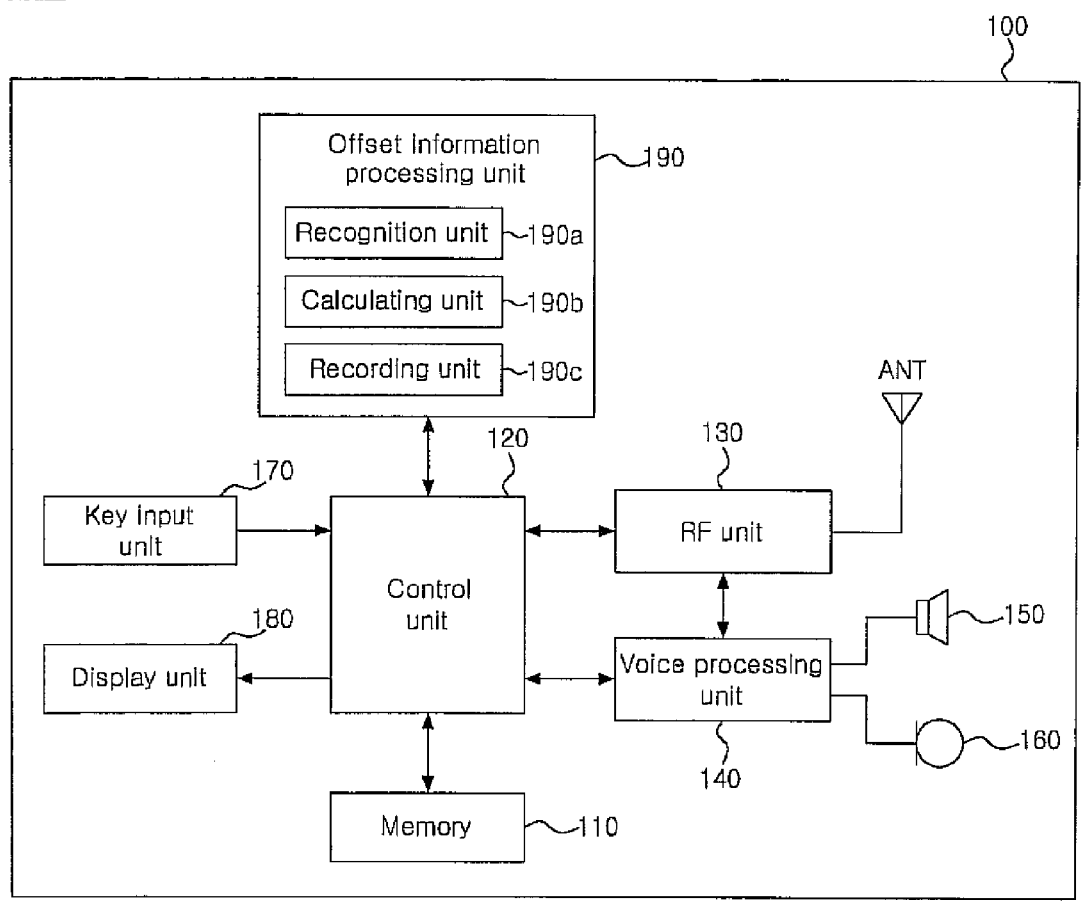
FIG. 1 is a block diagram illustrating a reproducing apparatus for performing a method of controlling a volume according to an embodiment of the present invention.

FIG. 1 is a block diagram illustrating a reproducing apparatus for performing a volume control method according to an embodiment of the present invention.

Referring to FIG. 1, a mobile communication terminal 100 for performing a volume control method according to the present invention comprises a memory 110 for storing at least one audio file and volume level information for controlling a reproduction volume level of the audio file, a control unit 120 for controlling a reproduction volume of the audio file in accordance with the volume level information recorded corresponding to the audio file to reproduce the audio file, a RF unit 130 for processing radio signals to communicate with other mobile communication terminals, a voice processing unit 140, a speaker 150, a microphone 160, a key input unit 170 including buttons, a display unit 180 including an external screen window and/or an internal screen window, and an offset information processing unit 190 for recording offset information calculated through volume control input from the outside.

In such a case, the volume level information comprises at least one of offset information and a value of the reproduction volume level.

The memory 110 stores an operating program and a system program for the control unit 120. The operating program or system program is stored in a ROM area and can be erased as necessary. An electrically erasable ROM includes an EEPROM, a flash memory or the like. Further, the memory 110 comprises a RAM for temporarily storing data calculated while a variety of operating programs are operated.

In addition, the memory 110 stores a variety of terminal information of the mobile communication terminal.

Further, the memory 110 stores at least one audio file, offset information calculated through volume control input from the outside while the audio file is reproduced, and a reference volume level for calculating the offset information. At this time, the offset information may be recorded and stored in a header of the audio file.

The reference volume level refers to a value of the volume level currently set on the mobile communication terminal 100 when there is a request for reproducing the audio file. The reference volume level can be controlled by a user. Further, the reference volume level is a volume level which becomes a reference value for calculating the offset information.

Further, the memory 110 stores a value of the reproduction volume level of the audio file. Here, the value of the reproduction volume level refers to a value corresponding to the sum of the offset information and the reference volume level in a case where the offset information of the audio file is recorded.

The offset information processing unit 190 calculates the offset information through the volume control input from the outside during the reproduction of the audio file and records the calculated offset information into the audio file.

More specifically, the offset information processing unit 190 comprises a recognition unit 190a, a calculating unit 190b and a recording unit 190c. The recognition unit 190a recognizes the input of a side key or volume control key provided in the mobile communication terminal 100 while the audio file is reproduced.

More particularly, the recognition unit 190a recognizes the volume level adjusted in accordance with key data of a key selected from a side key or button key by a user while the audio file is reproduced.

The calculating unit 190b calculates offset information in accordance with an input value recognized by the recognition unit 190a. In other words, the calculating unit 190b calculates the offset information either by comparing the reference volume level with the volume level adjusted in accordance with the input value recognized by the recognition unit 190a or by using an incremental value in accordance with a key recognized by the recognition unit 190a.

For example, the calculating unit 190b calculates the offset information (e.g., +2) either using an incremental value (e.g., +2) in accordance with a key recognized by the recognition unit 190a or by subtracting the reference volume level (e.g., 3) from the volume level (e.g., 5) adjusted through the volume control input from the outside while the audio file is reproduced.

The recording unit 190c records the offset information calculated into each audio file stored in the memory 110. For example, the recording unit 190c can record the offset information into the header of the audio file.

The offset information is recorded in the header of the audio file such that the reproduction volume level of the audio file can be adjusted in accordance with the offset information recorded in the header while the audio file is reproduced.

The audio file is composed of a header, audio data and auxiliary data. Here, information associated with the audio file including a layer, a sampling frequency, a song title, a singer and the like is recorded in the header. Furthermore, if the reproduction volume is adjusted, the offset information is recorded in the header of the audio file.

The control unit 120 controls the overall operation of the mobile communication terminal. At the same time, the control unit 120 adjusts the reproduction volume of the audio file in accordance with the volume level information reflected into the audio file and outputs the volume-controlled audio file while the audio file is reproduced.

Therefore, in a case where a plurality of audio files are stored in the memory 110, a user can reproduce each of the audio files at a desired reproduction volume level in accordance with the volume level information recorded in the relevant audio file.

The RF unit 130 is controlled by the control unit 120 and converts signals outputted from the control unit 120 into radio signals. Further, the RF unit 130 converts radio signals received via an antenna (ANT) into desired signals and outputs the converted signals.

The voice processing unit 140 modulates and converts voice signals input from the microphone 160 into voice data and demodulates voice data input from the RF unit 130 and stored in the memory 110 into voice signals. Then, the voice processing unit 140 outputs voice through the speaker 150.

The key input unit 170 is composed of a plurality of numeric keys, menu keys and function keys for performing a variety of functions. Further, the key input unit 170 outputs key data to the control unit 120 by the external operation.

Particularly, if a key for adjusting the reproduction volume is selected, the key input unit 170 outputs key data of the selected key to the control unit 120.

Here, an example of the key for adjusting the reproduction volume is a side key installed on an outer surface of the mobile communication terminal. However, the present invention is not limited thereto. That is, the reproduction volume can be adjusted by using a button key installed in the mobile communication terminal.

The display unit 180 is a display device such as a liquid crystal display (LCD). That is, the display unit 180 displays the status of the mobile communication terminal or the progress of program under the control of the control unit 120. More specifically, the display unit 180 displays an overall state of the mobile communication terminal, input user information, and the like.

Figure 2:
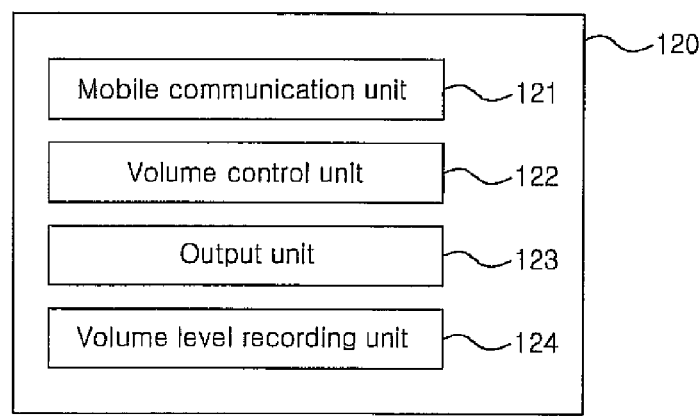
FIG. 2 is a block diagram specifically illustrating a control unit shown in FIG. 1.

Referring to FIG. 2, the control unit 120 comprises a mobile communication unit 121 for processing signals needed to perform the mobile communication service, a volume control unit 122, an output unit 123, and a volume level recording unit 124.

The mobile communication unit 121 is a module for performing the mobile communication service using the wireless communication resources in the mobile communication terminal. Since the mobile communication unit 121 is configured and operated in accordance with a well-known mobile communication technology, the detailed description thereof is omitted herein.

The volume control unit 122 controls the reproduction volume of the audio file based on the offset information recorded in the memory 110 by the recording unit 190c of the offset information processing unit 190.

For example, in a case where the offset information recorded in the audio file is '+2' and the reference volume level is '4' when the audio file is reproduced, the volume control unit 122 adjusts the reproduction volume level of the audio file to '6' in accordance with the offset information.

Further, in a case where the reproduction volume adjusted in accordance with the offset information recorded in the header of the audio file exceeds the maximum or minimum level, the volume control unit 122 controls the reproduction volume of the audio file to the maximum or minimum level.

That is, if the reproduction volume level can be adjusted within any one level from 'level 1' to 'level 8' in accordance with the offset information, the volume control unit 122 can control the reproduction volume to the minimum level, i.e. 'level 1' or the maximum level, i.e. 'level 8' in a case where the reproduction volume level adjusted in accordance with the offset information is below level 1 or above level 8.

In another aspect of the invention, if the reproduction volume level determined by the reference volume level and the offset information is high or low while the audio file is reproduced, the volume control unit 122 controls the reference volume level in accordance with a volume control key selected by a user. However, if the reproduction of the audio file is ended, the volume control unit 122 restores the adjusted reference volume level into the original reference volume level.

Accordingly, the reproduction volume level of a subsequently reproduced audio file can be adjusted in accordance with the restored original reference volume level and the offset information of the relevant audio file.

The output unit 123 amplifies audio data of the audio file to a relevant reproduction volume level by a gain of an audio amplifier and outputs the amplified audio data.

More specifically, the output unit 123 performs a gain control operation for increasing or decreasing the gain of the audio amplifier in accordance with the reproduction volume level adjusted by the volume control unit 122. Accordingly the output unit 123 amplifies the audio data of the audio file by the controlled gain and outputs the amplified audio data to the outside. This process can be applied only to a case where the offset information is stored in the header of the audio file.

Further, in a case where the offset information is not stored in the header of the audio filer the output unit 123 amplifies audio data by the gain controlled in accordance with the reference volume level and outputs the amplified audio data to the outside.

The volume level recording unit 124 records a value of the reproduction volume level into the memory 110 while the audio file is reproduced.

For example, in a case where the offset information recorded in the audio file is '+2' and the reference volume level is '4' while the audio file is reproduced, the volume level recording unit 124 records the value of the reproduction volume level '6' into the memory 110.

Accordingly, the output unit 123 amplifies the audio data by the gain of the audio amplifier controlled in accordance with the value (e.g., '6') of the reproduction volume level of the relevant audio file and outputs the amplified audio data to the outside. That is, the output unit 123 can output the audio data to be equal to the value of the reproduction volume level of the audio file or can convert and output the audio data to be different from the value of the reproduction volume level with reference to the value of the reproduction volume level of the audio file.

In this manner, the audio data can be outputted at the desired reproduction volume level in accordance with the volume level information previously adjusted and recorded by the user.

Now, a method of controlling a volume in the reproducing apparatus according to the present invention will be explained with reference to FIGS. 3 and 4.

Figure 3:
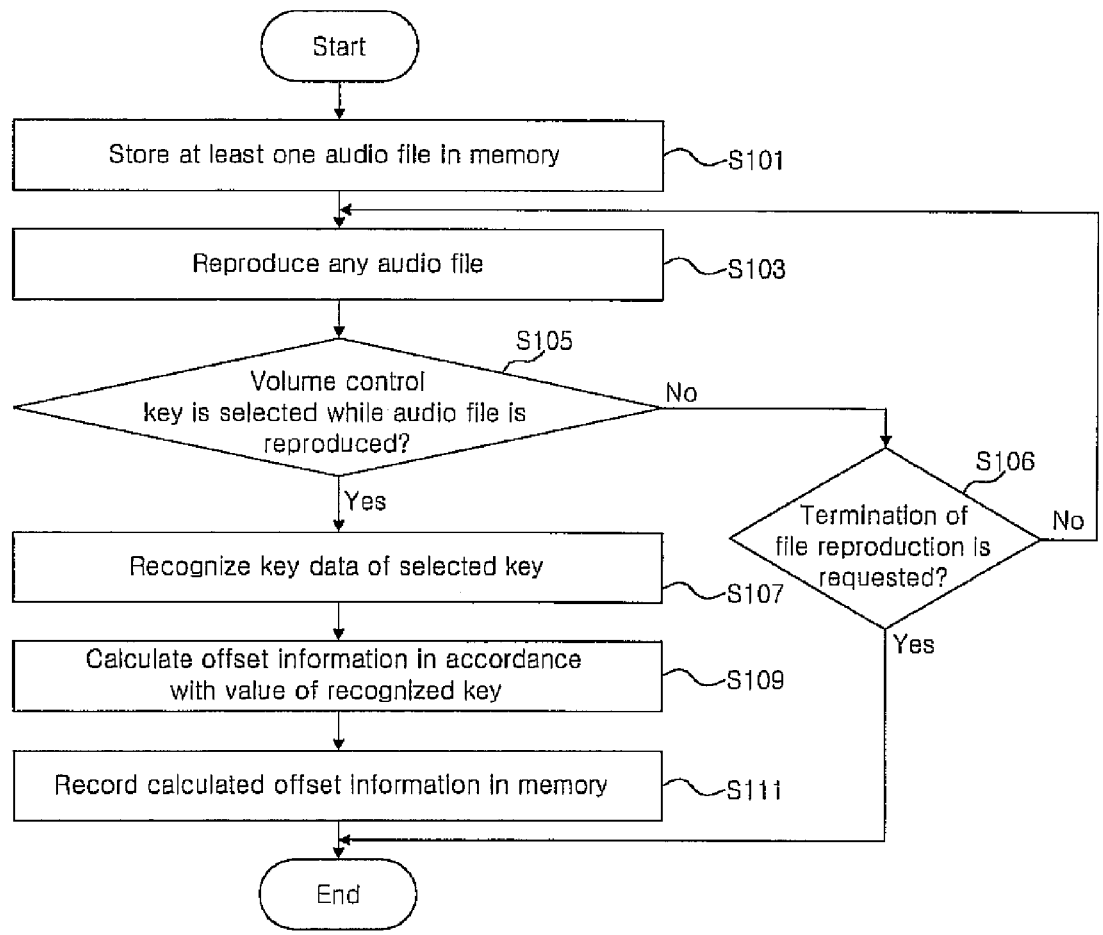
FIG. 3 is an operational flow chart illustrating a method of setting offset information for controlling a reproduction volume of the reproducing apparatus according to an embodiment of the present invention.
Figure 4:
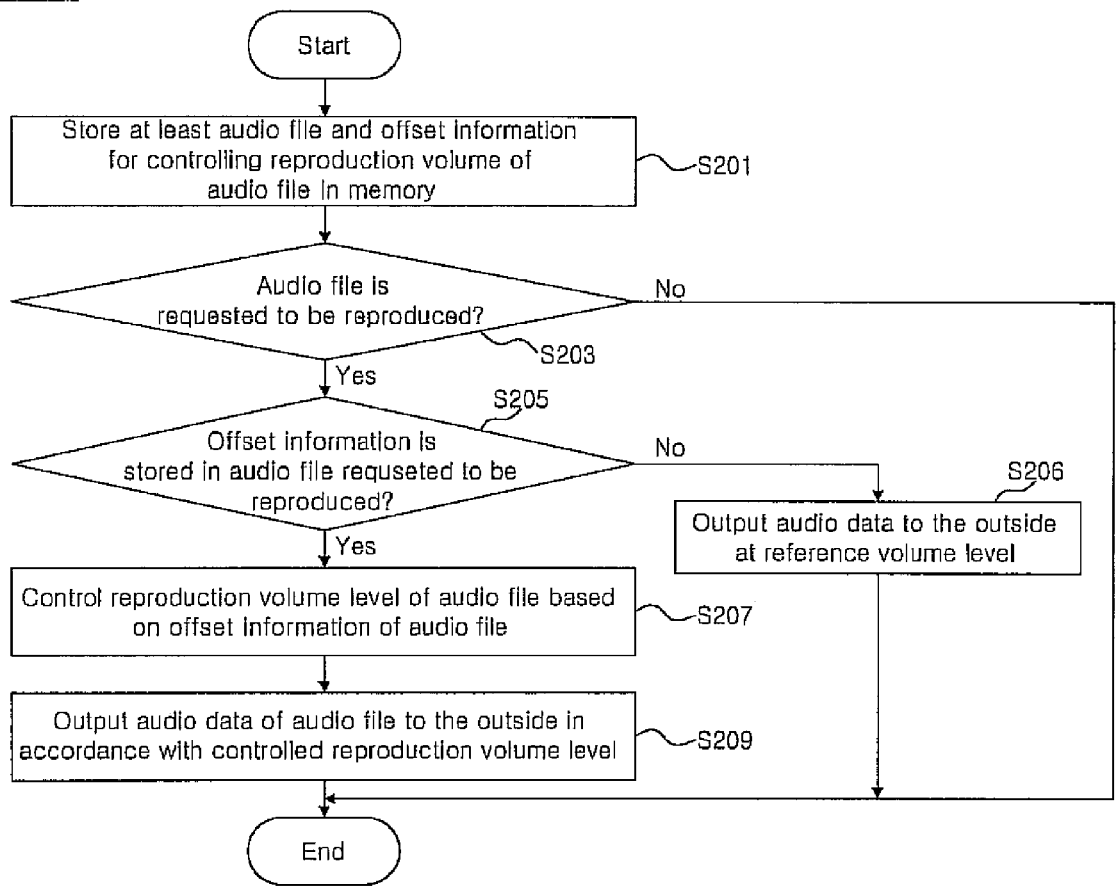
FIG. 4 is an operational flow chart illustrating a method of controlling a volume of the reproducing apparatus according to an embodiment of the present invention.

FIG. 3 is an operational flow chart illustrating a method of setting offset information for controlling a reproduction volume of the reproducing apparatus according to an embodiment of the present invention, and FIG. 4 is an operational flow chart illustrating a method of controlling a volume of the reproducing apparatus according to an embodiment of the present invention.

Referring to FIG. 3, the control unit 120 allows at least one audio file to be stored in the memory 110 (S101).

Next, the output unit 123 of the control unit 120 reproduces any audio file stored in the memory 110 in response to the request for reproduction by a user (S103).

Then, the recognition unit 190*a* of the offset information processing unit 190 determines whether a volume control key has been selected by the user while the audio file is reproduced (S105). That is, it is determined whether any one of a side key or button key for the volume control has been selected by the user while the audio file is reproduced.

If it is determined in step (S105) that the volume control key has not been selected by the user, the recognition unit 190*a* determines whether the user requests the reproduction of the audio file to be terminated (S106).

If it is determined in step (S106) that the user does not request the reproduction of the audio file to be terminated, the process in the control unit 120 returned to step (S103).

If it is determined in step (S106) that the user requests the reproduction of the audio file to be terminated, the control unit 120 terminates the process.

If it is determined in step (S105) that the volume control key has been selected by the user, the recognition unit 190*a* recognizes key data of the selected key (S107). At this time, the recognized key data indicate whether the volume level is decreased or increased.

Then, the calculating unit 190*b* of the offset information processing unit 190 calculates the offset information in accordance with a value of the recognized key (S109).

The calculated offset information is recorded in the header of the audio file and is then used to adjust the reproduction volume level of the audio file when a subsequent audio file is reproduced.

Here, in a case where the offset information has been previously recorded in the header of the audio file, the offset information processing unit 190 updates the offset information by summing up the offset information of the relevant audio file and the offset information calculated by the calculating unit 190*a*.

Then, the recording unit 190*c* of the offset information processing unit 190 records the offset information calculated by the calculating unit 190*b* into the header of the relevant audio file (S111).

Accordingly, the audio data are amplified and outputted at a controlled reproduction volume level determined by the reference volume level and the offset information recorded in the header of the audio file while the audio file is reproduced.

Although it has been described in this embodiment that the offset information calculated through the volume control input from the outside during the reproduction of the audio file is recorded in the memory 110, a value of the reproduction volume level of the audio file may be recorded in the memory 110 according to the other embodiments.

Hereinafter, a method of controlling the reproduction volume of the audio file based on the offset information recorded in the memory 110 will be described with reference to FIG. 4.

Although the method of controlling the reproduction volume of the audio file based on the offset information recorded in the memory 110 has been described in this embodiment, the reproduction volume of the audio file may be controlled based on a value of the reproduction volume level recorded in the memory 110 according to the other embodiments. In such a case, the control unit 120 outputs the audio data to the outside in accordance with the value of the reproduction volume level recorded in the memory 110 while the audio file is reproduced.

The control unit 120 allows at least one audio file and offset information for controlling the reproduction volume of the audio file to be stored in the memory 110 (S201).

Then, the volume control unit 122 of the control unit 120 determines whether the audio file has been requested to be reproduced (S203).

If it is determined in step (S203) that the audio file has not been requested to be reproduced, the volume control unit 122 terminates the process.

If it is determined in step (S203) that the audio file has been requested to be reproduced, the volume control unit 122 determines whether the offset information has been stored in the header of the audio file of which reproduction is requested (S205).

If it is determined in step (S205) that the offset information has not been stored in the header of the audio file whose reproduction is requested, the output unit 123 outputs the audio data at the reference volume level to the outside (S206).

If it is determined in step (S205) that the offset information has been stored in the header of the audio file whose reproduction is requested, the volume control unit 122 controls the reproduction volume level of the audio file based on the offset information of the audio file (S207).

Then, the output unit 123 outputs the audio data of the audio file to the outside at the adjusted reproduction volume level (S209).

In this manner, the audio data can be outputted at the reproduction volume level adjusted in accordance with the offset information beforehand set by a user.

Furthermore, in a case where first to fifth audio files are stored in the memory 110, the control unit 120 records the offset information calculated through the volume level control performed while each of the first to fifth audio files is reproduced.

Here, assuming that the offset information recorded in the first to fifth audio files is '0', '+1', '0', '−1' and '+2'. If the reference volume level is level 5, the control unit 120 will change the reproduction volume levels of the first to fifth audio files to '5', '6', '5', '4' and '7', respectively, and then output the audio data to the outside at the changed volume levels.

Further, if the reference volume level is increased by '1' by means of a volume control key while the second audio file is reproduced, the control unit 120 updates the offset information (e.g., '+2') by summing up the offset information (e.g., '+1') calculated by the incremented reference volume level and the offset information (e.g., '+1') previously recorded in the header of the second audio file.

Then, the reproduction volume levels for the subsequently reproduced audio files are restored to the original reference volume levels, i.e. '5' for the third audio file, '4' for the fourth audio file and '7' for the fifth audio file, so that the audio data are outputted to the outside at the above volume levels.

Although it has been described in this embodiment that the offset information is recorded in the audio file, the offset information may be recorded in a region additionally allocated in the memory 110 other than in the audio file according to the other embodiments. At this time, identification information of the audio file may be also stored in the additional region.

In such a case, when an audio file is reproduced, the control unit 120 determines whether the offset information has been separately recorded in the audio file. If the offset information has been separately recorded in the audio file, the control unit 120 can control the reproduction volume of the audio file based on the offset information recorded in the relevant audio file. Therefore, the control unit 120 can control the reproduction volume of the audio file with reference to the offset information stored in the additional region without changing information on the audio file.

Further, although it has been described in this embodiment that the offset information recorded in the memory 110 is updated with the offset information input again by and calculated from a user, the offset information before update can be recorded as a history according to the other embodiments.

In such a case, the control unit 120 of FIG. 1 can control the reproduction volume level in accordance with the offset information selected from the history already recorded by a user and then amplify and output the audio data at the controlled level. Therefore, the user can keep the history of listening to music, and thus, will be able to listen to music even in the future.

Further, although it has been described in this embodiment that the reproduction volume level of the audio file is adjusted in accordance with the offset information calculated through the volume level control performed while the audio file is reproduced, a setting mode is additionally provided to set offset information to be recorded in the header of the audio file, according to the other embodiments, such that the offset information of each audio file can be first set through the execution of the setting mode and the reproduction volume level of the audio file can be then adjusted.

That is, if the user selects the setting mode in order to set the offset information of the audio file, the volume control unit 122 of FIG. 2 can simply set the offset information since the offset information for the relevant audio file can be set even though the audio file is not being reproduced.

More specifically, if the user selects the setting mode, the volume control unit 122 provides at least one operation mode (e.g., day mode, night mode, company mode, home mode, silent mode, noisy mode, etc.) and receives volume levels (e.g., +10, −3, +5, −1, −7, +15, etc.) set according to the provided operation modes. At this time, the set volume levels are stored in the memory 110. Therefore, the volume control unit 122 can control the reproduction volume level based on the volume level of the operation mode and the offset information of the audio file while operating at the relevant operation mode.

Further, a case where the reproduction volume of subsequently reproduced audio files is adjusted is described in this embodiment. However, even in a case where an audio file is randomly selected and reproduced, the reproduction volume of the selected audio file can be adjusted accordingly.

Further, it has been described in this embodiment that the reproduction volume level of an audio file stored in the memory of the reproducing apparatus is controlled. However, if the audio file set with the offset information is transmitted to the other reproducing apparatus, the reproduction volume level of the relevant audio file can also be adjusted in the other reproducing apparatus in accordance with the offset information of the audio file. At this time, the other reproducing apparatus should be loaded with a program capable of reflecting the offset information of the audio file to reproduce the audio file.

According to the present invention, the reproduction volume of the audio file can be automatically adjusted in accordance with the volume level information of the audio file. Therefore, there is an advantage in that a user does not have to individually control the reproduction volume of the audio file at a desired level even though different volume levels are set for the audio files.

Further, there is another advantage in that the user can always listen to music at a certain time since the volume level information including the reproduction volume level suitable to the user can be stored.

The present invention is not limited to the embodiments described above, and those skilled in the art can make various changes and modifications thereto. The various changes and modifications fall within the spirit and scope of the present invention defined by the appended claims.

As the present invention may be embodied in several forms without departing from the spirit or essential characteristics thereof it should also be understood that the above-described embodiments are not limited by any of the details of the foregoing description, unless otherwise specified, but rather should be construed broadly within it spirit and scope as defined in the appended claims, and therefore all changes and modifications that fall within the metes and bounds of the claims, or equivalents of such metes and bounds are therefore intended to be embraced by the appended claims.

The foregoing embodiments and advantages are merely exemplary and are not to the construed as limiting the present invention. The present teaching can be easily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. A reproducing apparatus, comprising:
    a memory storing at least one audio file and volume level information for controlling a reproduction volume level of the at least one audio file, the volume level information including a value of a reproduction volume level that is controllable by a user, a controlled value of the reproduction volume level being used as a reference value for calculating offset information;
    a control unit configured to control the reproduction volume level of the at least one audio file in accordance with at least the volume level information recorded corresponding to the at least one audio file when the at least one audio file stored in the memory is reproduced; and
    an offset information processing unit configured to calculate the offset information based on the reference value received through a volume control input unit and recording the calculated offset information in the memory and the at least one audio file while the at least one audio file is reproduced,
    wherein the control unit is further configured to:
        reproduce the at least one audio file at a first reproduction volume level based on the volume level information, a value of the first reproduction volume level corresponding to the value of the reproduction volume level set in the apparatus, in response to an initial request for reproducing the at least one audio file or if no offset information has been recorded in the at least one audio file;
        reproduce the at least one audio file at a second reproduction volume level adjusted based on the volume level information and the offset information if the offset information has been recorded in the at least one audio file, a value of the second reproduction volume level corresponding to a sum of a value of the recorded offset information and the reference value; and
        reproduce the at least one audio file at a maximum or minimum reproduction volume level if a value of the sum exceeds a value of the maximum or is less than a value of the minimum reproduction volume level set in the reproducing apparatus.

2. The reproducing apparatus of claim 1, wherein the offset information processing unit comprises:
    a recognition unit configured to recognize an input of a reproduction volume level received via a predetermined key while the at least one audio file is reproduced;
    a calculating unit configured to calculate the offset information in accordance with an input value, corresponding to the received reproduction volume level, recognized by the recognition unit; and
    a recording unit configured to record the offset information calculated by the calculating unit in the memory.

3. The reproducing apparatus of claim 2, wherein the offset information processing unit updates the offset information by summing up the offset information recorded in the at least one audio file and offset information calculated from another input of the predetermined key.

4. The reproducing apparatus of claim 2, wherein the control unit comprises:
    a volume control unit for controlling the reproduction volume level of the at least one audio file in accordance with the offset information stored in the memory; and
    an output unit for outputting audio data of the at least one audio file at the reproduction volume level controlled by the volume control unit.

5. The reproducing apparatus of claim 1, wherein the control unit further comprises a volume level recording unit for recording the value of the adjusted reproduction volume level of the at least one audio file in the memory and outputs audio data of the at least one audio file in accordance with the recorded value of the adjusted reproduction volume level.

6. The reproducing apparatus of claim 4, wherein the volume control unit controls the reproduction volume level by reflecting the offset information of the at least one audio file and a volume level of an operating mode selected from at least one operating mode comprising at least a day mode, a night mode, a company mode, a home mode, a silent mode, or a noisy mode, each of the at least one operating mode having a set volume level.

7. The reproducing apparatus of claim 2, wherein the recording unit records the offset information set through the volume control input unit in a region additionally allocated in the memory.

8. The reproducing apparatus of claim 2, wherein the recording unit records the offset information set through the volume control input unit as a history.

9. The reproducing apparatus of claim 8, wherein the control unit controls the reproduction volume level in accordance with the offset information selected from the history.

10. The reproducing apparatus of claim 1, wherein the offset information is recorded in a header of the at least one audio file such that the reproduction volume level of the at least one audio file can be adjusted in accordance with the offset information while the at least one audio file is reproduced.

11. The reproducing apparatus of claim 10, wherein when a plurality of audio files are stored in the memory, the control unit is further configured to reproduce each of the plurality of audio files in accordance with a recorded volume level corresponding to each of the plurality of audio files.

12. The reproducing apparatus of claim 1, wherein when the at least one audio file is transferred to a second reproducing apparatus, a reproduction volume level is adjusted in the second reproducing apparatus in accordance with the offset information recorded in the at least one audio file, the second reproducing apparatus being an apparatus that is capable of controlling the reproduction volume level in accordance with the offset information when the at least one audio file is reproduced.

13. The reproducing apparatus of claim 1, wherein the reproducing apparatus is one of a mobile communication terminal, an MP3 player, a home theatre system, a computer system, and a karaoke system, and the value of the offset information is recorded in the at least one audio file as desired by the user such that the reproduction volume level is automatically controlled in accordance with the desired offset information to output audio data of the at least one audio file at a desired reproduction volume level.

14. A method of controlling a volume of an apparatus for reproducing at least one audio file, the method comprising:
    storing the at least one audio file and volume level information for controlling a reproduction volume of the at least one audio file in a memory, the volume level information including a value of a reproduction volume level that is controllable by a user, a controlled value of the reproduction volume level being used as a reference value for calculating offset information;
    receiving input for reproducing the at least one audio file;
    determining whether the at least one audio file to be reproduced includes the offset information;
    controlling the reproduction volume level in accordance with at least the stored volume level information when the at least one audio file stored in the memory is reproduced;
    calculating the offset information based on the reference value received through a volume control input unit and recording the calculated offset information in the memory and in the at least one audio file while the at least one audio file is reproduced;
    reproducing the at least one audio file at a first reproduction volume level based on the volume level information, a value of the first reproduction volume level corresponding to the value of the reproduction volume level set in the apparatus, in response to an initial request for reproducing the at least one audio file or when it is determined that no offset information has been recorded in the at least one audio file;
    reproducing the at least one audio file at a second reproduction volume level adjusted based on the volume level information and the offset information when it is determined that the offset information has been recorded in the at least one audio file, a value of the second reproduction volume level corresponding to a sum of a value of the recorded offset information and the reference value; and
    reproducing the at least one audio file at a maximum or minimum reproduction volume level if a value of the sum exceeds a value of the maximum or is less than a value of the minimum reproduction volume level set in the reproducing apparatus.

15. The method of claim 14, wherein when the at least one audio file is transferred to a second apparatus, a reproduction volume level is adjusted in the second apparatus in accordance with the offset information recorded in the at least one audio file, the second apparatus being an apparatus that is capable of controlling the reproduction volume level in accordance with the offset information when the at least one audio file is reproduced.

16. The method of claim 14, wherein when a plurality of audio files are reproduced in the apparatus and offset information of each of the plurality of audio files is differently set from each other, a reproduction volume level of each of the plurality of audio files is adjusted in accordance with the offset information of each of the plurality of audio files such that the adjusted reproduction volume levels of the plurality of audio files are different.

17. The method of claim 16, wherein calculating the offset information comprises:
    recognizing an input of a reproduction volume level received via a predetermined volume control key while the at least one audio file is reproduced;
    calculating the offset information in accordance with an input value recognized by the recognition step; and
    recording the offset information calculated by the calculating step in the memory.

18. The method of claim 17, wherein the offset information processing step comprises updating the offset information by summing up the offset information recorded in the at least one audio file and offset information calculated from another input of the predetermined key.

19. The method of claim 14, further comprising outputting audio data of the at least one audio file at the reproduction volume level set in the apparatus, when it is determined that the volume level information has not been recorded in the memory.

20. The method of claim 14, further comprising outputting audio data of the at least one audio file in accordance with the recorded value of the reproduction volume level.

21. The method of claim 14, wherein the controlling step comprises controlling the reproduction volume level by reflecting the offset information of the at least one audio file and a volume level of an operating mode selected from at least one operating mode and outputting audio data of the at least one audio file at the controlled reproduction volume level.

22. The method of claim 17, wherein the recording step comprises recording the offset information set in accordance with the value of the reproduction volume level input by a user in a region additionally allocated in the memory.

23. The method of claim 17, wherein the recording step comprises recording the offset information set in accordance with the value of the reproduction volume input by a user as a history.

24. The method of claim 23, wherein the outputting step comprises controlling the reproduction volume level in accordance with the offset information selected from the history.

25. The method of claim 14, wherein the offset information is recorded in a header of the at least one audio file such that the reproduction volume level of at least one audio file can be adjusted in accordance with the offset information while the at least one audio file is reproduced.

26. The method of claim 14, wherein the value of the offset information is recorded in the at least one audio file as desired by the user such that the reproduction volume level is automatically controlled in accordance with the desired offset information to output audio data of the at least one audio file at a desired reproduction volume level.

27. The method of claim 14, wherein when a plurality of audio files are stored in the memory, offset information of each of the plurality of audio files is recorded independently according to a reference value set by the user for each of the plurality of audio files.

28. The method of claim 14, wherein the at least one operating mode comprises at least a day mode, a night mode, a company mode, a home mode, a silent mode, or a noisy mode.

* * * * *